United States Patent
Yoda et al.

(10) Patent No.: US 9,068,835 B2
(45) Date of Patent: Jun. 30, 2015

(54) FUNCTIONAL ELEMENT, SENSOR ELEMENT, ELECTRONIC APPARATUS, AND METHOD FOR PRODUCING A FUNCTIONAL ELEMENT

(75) Inventors: Mitsuhiro Yoda, Shiojiri (JP); Shuichi Kawano, Suwa (JP); Shigekazu Takagi, Shimosuwa (JP); Seiji Yamazaki, Fujimi (JP)

(73) Assignee: Seiko Epson Corporation (JP)

( * ) Notice: Subject to any disclaimer, the term of this patent is extended or adjusted under 35 U.S.C. 154(b) by 468 days.

(21) Appl. No.: 13/449,619

(22) Filed: Apr. 18, 2012

(65) Prior Publication Data

US 2012/0267150 A1    Oct. 25, 2012

(30) Foreign Application Priority Data

Apr. 20, 2011   (JP) ................. 2011-094232

(51) Int. Cl.
*H05K 1/11*   (2006.01)
*G01C 19/5783*   (2012.01)
*G01P 15/08*   (2006.01)
*G01P 15/125*   (2006.01)

(52) U.S. Cl.
CPC ............ *G01C 19/5783* (2013.01); *H05K 1/118* (2013.01); *G01P 15/0802* (2013.01); *G01P 15/125* (2013.01); *G01P 2015/0814* (2013.01)

(58) Field of Classification Search
CPC ..................................................... H05K 1/118
USPC .................................... 174/261; 361/767–779
See application file for complete search history.

(56) References Cited

U.S. PATENT DOCUMENTS

| 5,436,411 | A  | * | 7/1995  | Pasch ............................ 174/261 |
| 6,170,332 | B1 |   | 1/2001  | MacDonald et al. |
| 6,239,473 | B1 |   | 5/2001  | Adams et al. |
| 6,342,430 | B1 |   | 1/2002  | Adams et al. |
| 6,388,300 | B1 |   | 5/2002  | Kano et al. |
| 6,568,267 | B2 |   | 5/2003  | Chida et al. |
| 7,855,341 | B2 | * | 12/2010 | Chambers ..................... 174/254 |
| 8,680,404 | B2 | * | 3/2014  | Ryoichi et al. ................ 174/262 |
| 2003/0176008 | A1 | | 9/2003 | Okumura et al. |
| 2004/0021186 | A1 | | 2/2004 | Okumura et al. |

FOREIGN PATENT DOCUMENTS

| CN | 1447988 A | 10/2003 |
| JP | 2002-510139 | 4/2002 |
| JP | 4238437 | 1/2009 |
| WO | 1999-36941 | 7/1999 |
| WO | WO-03-012853 A1 | 2/2003 |

* cited by examiner

*Primary Examiner* — Jeremy C Norris
(74) *Attorney, Agent, or Firm* — Harness, Dickey & Pierce, P.L.C.

(57) ABSTRACT

A functional element including a substrate having a principal surface, a groove portion (a first groove portion, a second groove portion) disposed on the principal surface, and a fixed electrode section (a first fixed electrode finger, a second fixed electrode finger) laid across the groove portion on the substrate, wherein, in the groove portion, a raised portion formed by using at least one of the substrate and the fixed electrode section is provided in a position overlapping with the fixed electrode section in a plan view, the raised portion has a bonded surface (an end face), a wiring line (a first wiring line, a second wiring line) is disposed on the bonded surface, and the substrate and the fixed electrode section are connected with the wiring line sandwiched between the substrate and the fixed electrode section.

18 Claims, 10 Drawing Sheets

FUNCTIONAL ELEMENT, SENSOR ELEMENT, ELECTRONIC APPARATUS, AND METHOD FOR PRODUCING A FUNCTIONAL ELEMENT

BACKGROUND

1. Technical Field

The present invention relates to functional elements, sensor elements, electronic apparatus, and methods for producing a functional element.

2. Related Art

As a functional element, a physical quantity sensor element having a fixedly-disposed fixed electrode and a movable electrode which is a movable element section, the movable electrode provided in such a way as to face the fixed electrode with a clearance left between the fixed electrode and the movable electrode and to be able to be displaced, the physical quantity sensor element detecting physical quantities such as acceleration and angular velocity based on the capacitance between the fixed electrode and the movable electrode, has been known (see Japanese Patent No. 4238437 (Patent Document 1) and JP-T-2002-510139 (Patent Document 2)). The physical quantity sensor elements of Patent Document 1 and Patent Document 2 have a structure in which comb electrode sections are mechanically connected to each other while being electrically insulated from each other by a groove filled with an insulating material so that capacitive detection can be performed in a differential manner.

For example, the physical quantity sensor element described in Patent Document 1 uses a single-layer semiconductor substrate or an SOI substrate, and the fixed electrode and the movable electrode each have a plurality of electrode fingers arranged to form the shape of a comb and are disposed in such a way as to mesh with each other.

Moreover, in the physical quantity sensor element described in Patent Document 1, between two electrode fingers, which are located next to each other, of the movable electrode, two electrode fingers of the fixed electrode are provided in such a way as to face each other, and the electrode fingers of the fixed electrode are electrically insulated from each other. This makes it possible to measure independently the capacitance between one of the two electrode fingers of the fixed electrode and the electrode finger of the movable electrode, the electrode finger facing the one electrode finger of the fixed electrode, and the capacitance between the other electrode finger of the fixed electrode and the electrode finger of the movable electrode, the electrode finger facing the other electrode finger of the fixed electrode, and detect physical quantities based on measurement results thus obtained (by using a so-called differential detection method).

Furthermore, in Patent Document 1 and Patent Document 2, the physical quantity sensor element is formed by performing dry etching etc. on the single-layer semiconductor substrate to form a cavity below a movable structure. By using such a method, it is possible to form a sensor structure including an isolated structure by using only a single-layer substrate and prevent a production process from becoming complicated.

However, in Patent Document 1 and Patent Document 2, since a structure in which the isolated movable structure is suspended in the air by forming the cavity by the dry etching etc. in the single-layer semiconductor substrate is adopted, there are restrictions on the thickness and shape of the movable structure, which makes it difficult to achieve higher sensitivity and increased impact resistance.

In particular, in the physical quantity sensor element described in Patent Document 1, the electrode fingers have to be isolated individually so that the fixed electrode and the movable electrode are not brought into conduction, which reduces production efficiency. Furthermore, the SOI substrate is generally expensive, resulting in an increase in cost.

SUMMARY

An advantage of some aspects of the invention is to provide a functional element, a sensor element, an electronic apparatus, and a method for producing a functional element, the functional element, the sensor element, the electronic apparatus, and the method that prevent a reduction in production efficiency.

Application Example 1

This application example is directed to a functional element including: a substrate having a principal surface; a groove portion disposed on the principal surface; and a fixed element section laid across the groove portion on the substrate, wherein, in the groove portion, a raised portion formed by using at least one of the substrate and the fixed element section is provided in a position overlapping with the fixed element section in a plan view, the raised portion has a bonded surface, a wiring line is disposed on the bonded surface, and the substrate and the fixed element section are connected with the wiring line sandwiched between the substrate and the fixed element section. Moreover, this application example is directed to a functional element including: a substrate having a principal surface on which a groove portion is provided, the groove portion in which a wiring line is provided; and a fixed electrode section laid across the groove portion on the substrate, wherein, in a connection between the fixed electrode section and the wiring line, a raised portion formed by using at least one of the substrate and the fixed electrode section is disposed.

In the structure described above, since the wiring line is disposed in the groove portion, it is possible to prevent a short circuit between the wiring line and other component elements disposed on the substrate. Moreover, by forming the raised portion in the groove portion and connecting the wiring line disposed in the groove portion to the fixed electrode section disposed on the substrate in a state in which the wiring line is disposed on the bonded surface of the raised portion, it is possible to connect the wiring line and the fixed electrode section without increasing the thickness of a portion of the wiring line, the portion which is connected to the fixed electrode section. This makes it possible to bond the wiring line and the fixed electrode section while maintaining the flatness of the wiring line in a thickness direction. Therefore, a functional element that increases the reliability of electrical connection between the wiring line and the fixed electrode section is provided.

Application Example 2

This application example is directed to the functional element described in Application Example 1, in which the raised portion is formed integrally with the substrate and the bonded surface of the raised portion is flush with the principal surface of the substrate.

In the structure described above, since the strength of the raised portion can be ensured by the strength of the substrate, it is possible to increase the reliability of electrical connection between the wiring line and the fixed electrode section.

Application Example 3

This application example is directed to the functional element described in Application Example 1 or 2, in which, between the substrate and the fixed electrode section, an insulating film is provided in a region other than the raised portion.

The structure described above makes it possible to obtain isolation between the wiring line and other component elements on the substrate. In this case, the fixed electrode section and the insulating film are connected, and it is also possible to obtain isolation between the fixed electrode section and other component elements on the substrate.

Application Example 4

This application example is directed to the functional element described in any one of Application Examples 1 to 3, in which, on the substrate, a movable section is disposed, and, in the movable section, a movable electrode section is provided in a position facing the fixed electrode section.

In the structure described above, a position of the movable section relative to the fixed electrode section changes as a result of the movable section undergoing acceleration etc., and this change in the relative position of the movable section changes the capacitance between the movable electrode section provided in the movable section and the fixed electrode section. Therefore, by monitoring the change in the capacitance, it is possible to provide a sensor that detects a physical quantity such as acceleration applied to the functional element.

Application Example 5

This application example is directed to the functional element described in any one of Application Examples 1 to 4, in which the substrate is formed of an insulating material and the fixed electrode section is formed of a semiconductor material.

The structure described above makes it possible to provide isolation between the substrate and the fixed electrode section with ease.

Application Example 6

This application example is directed to a sensor element including the functional element described in any one of Application Examples 1 to 5.

The structure described above provides a sensor element that increases the reliability of connection between the substrate and the fixed electrode section and increases the reliability of isolation between the fixed electrode section and other component elements on the substrate.

Application Example 7

This application example is directed to an electronic apparatus including the functional element described in any one of Application Examples 1 to 5.

The structure described above provides an electronic apparatus that increases the reliability of connection between the substrate and the fixed electrode section and increases the reliability of isolation between the fixed electrode section and other component elements on the substrate.

Application Example 8

This application example is directed to a method for producing a functional element, the method including: forming a groove portion on a principal surface of a substrate and a raised portion in at least part of the inside of the groove portion; forming a wiring line in the groove portion and on an end face of the raised portion; and bonding a fixed electrode section to the raised portion with the wiring line sandwiched between the fixed electrode section and the raised portion, wherein, after the forming of a wiring line, a surface of the wiring line formed on the end face of the raised portion juts to a level higher than a level of the principal surface of the substrate.

With the method described above, it is possible to increase the reliability of connection between the substrate and the fixed electrode section and increase the reliability of isolation between the fixed electrode section and other component elements on the substrate. Moreover, since the surface of the wiring line formed on the bonded surface of the raised portion juts to the level higher than the level of the principal surface of the substrate after the forming of a wiring line, when the fixed electrode section is bonded to the substrate, it is possible to bond the raised portion and the fixed electrode section firmly.

Application Example 9

This application example is directed to the method for producing a functional element described in Application Example 8, which further includes: forming a buffer film on the wiring line formed on the end face of the raised portion after the forming of a wiring line.

With the method described above, by placing the buffer film between the wiring line and the fixed electrode section, it is possible to make the surface of the wiring line formed on the bonded surface of the raised portion jut to the level higher than the level of the principal surface of the substrate. Moreover, this method makes it possible to adjust the level of the jutted portion with the buffer film and thereby bond the raised portion and the fixed electrode section more firmly.

Application Example 10

This application example is directed to the method for producing a functional element described in Application Example 8 or 9, which further includes: forming an insulating film on the principal surface of the substrate and the insulating film in at least a portion corresponding to the end face of the raised portion is removed after the forming of a wiring line, wherein, after the forming of an insulating film, the surface of the wiring line formed on the end face of the raised portion juts to a level higher than a level of a surface of the insulating film formed on the principal surface of the substrate.

With the method described above, it is possible to obtain isolation between the wiring line and other component elements on the substrate. In this case, the fixed electrode section and the insulating film are connected, and it is also possible to obtain isolation between the fixed electrode section and other component elements on the substrate. Moreover, after the forming of an insulating film, since the surface of the wiring line formed on the end face of the raised portion juts to the level higher than the level of the surface of the insulating film formed on the principal surface of the substrate, when the fixed electrode section is bonded to the substrate, it is possible to bond the raised portion and the fixed electrode section firmly.

Application Example 11

This application example is directed to the method for producing a functional element described in any one of Application Examples 8 to 10, in which the substrate is formed of a material containing an alkali metal ion, the fixed electrode section is formed of a semiconductor material, and, in the bonding of a fixed electrode section, the substrate and the fixed electrode section are bonded together by anodic bonding.

With the method described above, it is possible to bond the substrate and the fixed electrode section firmly. Moreover, when the substrate is formed as an insulating glass substrate containing an alkali metal ion, it is possible to provide isolation between the substrate and the fixed electrode section with ease.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the invention will be described in detail by using an embodiment shown in the drawings. However, unless specifically described, component elements, type, combination, shape, relative arrangement, etc. which are described in the embodiment are not meant to limit the scope of the invention and are mere explanatory examples.

Figure 1:
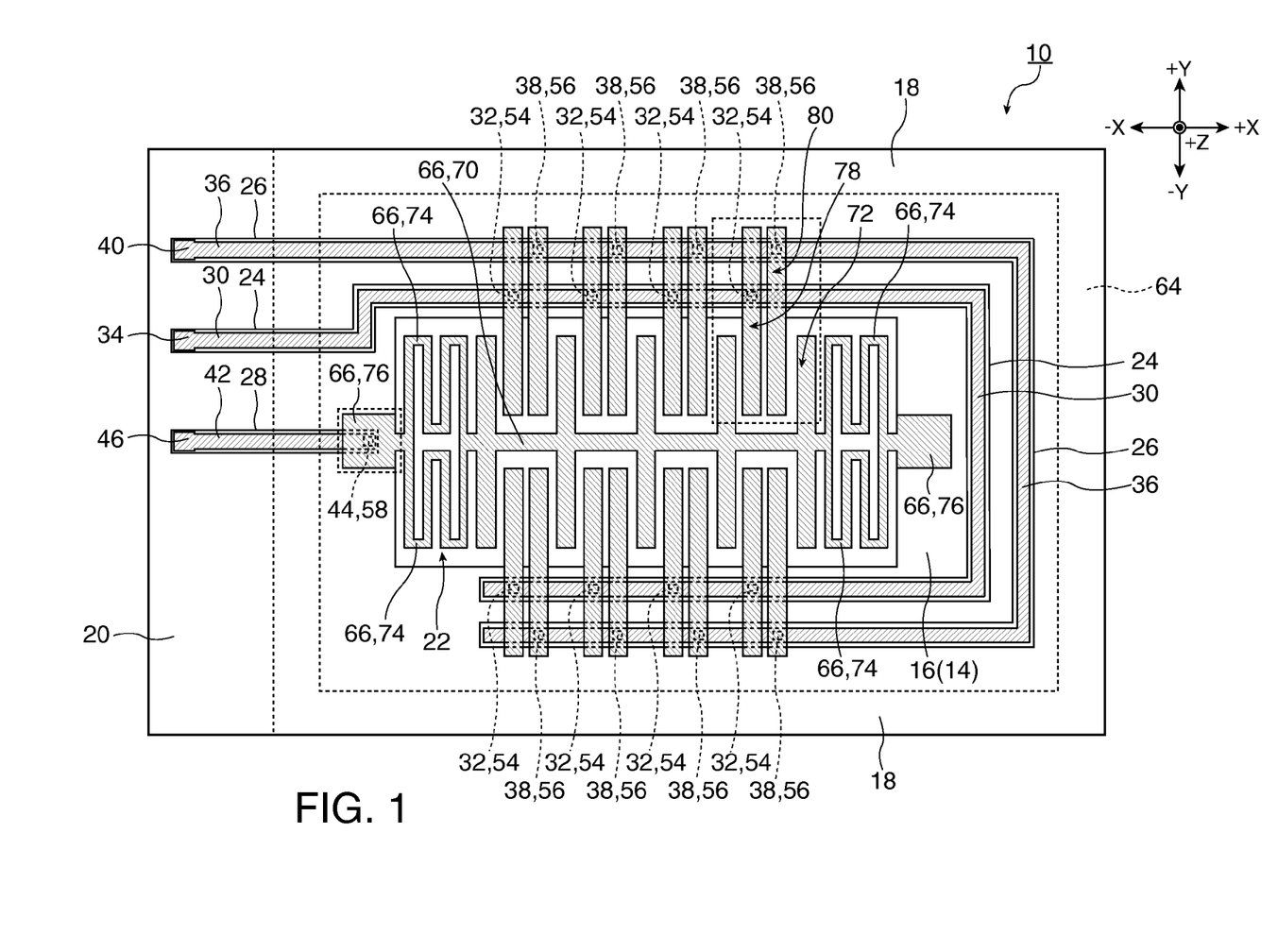
FIG. 1 is a plan view of a functional element according to an embodiment.
Figure 2:
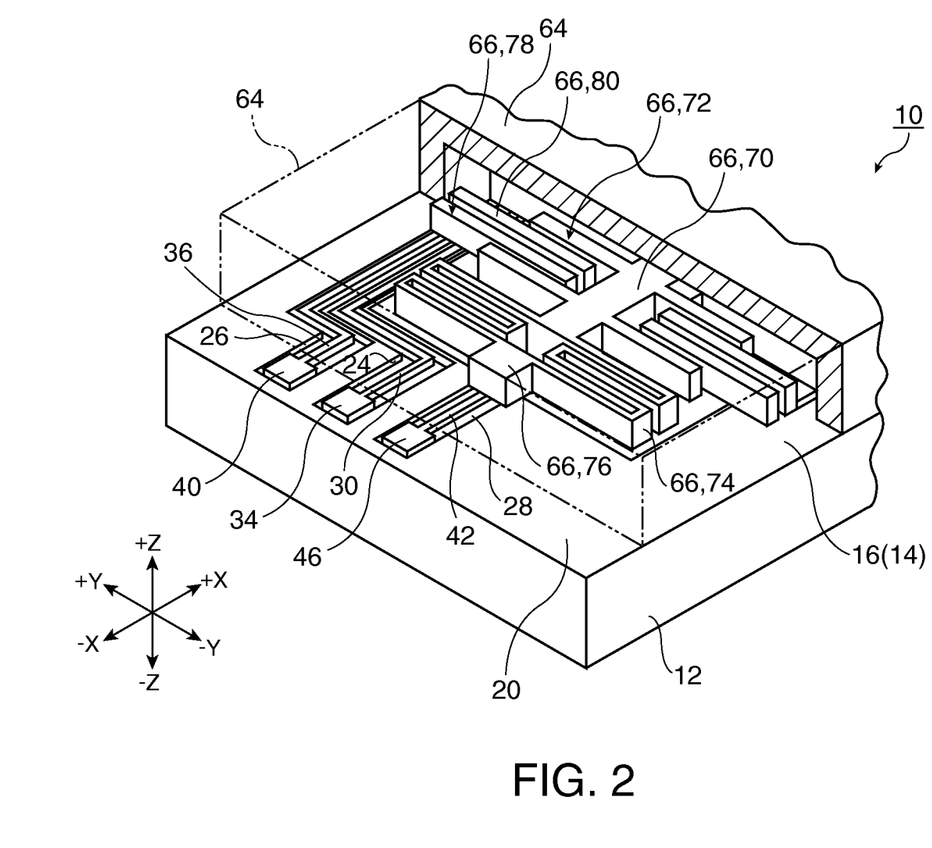
FIG. 2 is a perspective view of the functional element according to the embodiment.

In FIG. 1, a plan view of a functional element according to the embodiment is shown, and, in FIG. 2, a perspective view of the functional element according to the embodiment is shown. A functional element 10 of the embodiment has a structure in which a semiconductor substrate 66 (see FIGS. 5 and 9) is stacked on a substrate 12, and a movable section 68 and a fixed electrode section (first fixed electrode fingers 78 and second fixed electrode fingers 80) are cut out, by etching, from the semiconductor substrate 66 stacked on the substrate 12 and are sealed with a lid 64.

The substrate 12 has a principal surface 16 which is bonded to the semiconductor substrate 66, and the principal surface 16 has a frame outer region 18 which becomes the perimeter of the semiconductor substrate 66 in a plan view of the principal surface 16, the outer region 18 to which the lid 64 is to be bonded, and a terminal section 20 provided with terminal electrodes which will be described later. Moreover, in a position of the principal surface 16 of the substrate 12, the position located inside the semiconductor substrate 66 in a plan view, a recessed portion 22 is disposed. The recessed portion 22 is provided to avoid the interference between the movable section 68, which will be described later, and the substrate 12. Therefore, the recessed portion 22 is formed in a position located within the principal surface 16 and facing the movable section 68. Incidentally, as will be described later, an insulating layer 62 (see FIG. 5 etc.) is formed on the principal surface 16 of the substrate 12, and a surface of the insulating layer 62 becomes a bonded surface 14 which is bonded to the semiconductor substrate 66.

Moreover, a first groove portion 24 is disposed along the perimeter of the recessed portion 22, and, in a position along the perimeter of the first groove portion 24, the position away from the first groove portion 24, a second groove portion 26 is disposed. Furthermore, in a position away from the first groove portion 24 and the second groove portion 26, a third groove portion 28 is disposed. The first groove portion 24, the second groove portion 26, and the third groove portion 28 are disposed from an inner region of the outer region 18 of the principal surface 16 to the terminal section 20. In FIG. 1, the first groove portion 24 and the second groove portion 26 are disposed in a shape of a letter U as a whole in FIG. 1. However, the first groove portion 24 and the second groove portion 26 may be disposed in other shapes as long as they are away from each other.

As a material of the substrate 12, specifically, it is preferable to use a high-resistance silicon material or glass material. In particular, when the semiconductor substrate 66 is formed by using a silicon material as a chief material, it is preferable to use a glass material (for example, borosilicate glass such as Pyrex®) containing an alkali metal ion (a movable ion). As a result, when the semiconductor substrate 66 is formed by using silicon as a chief material, it is possible to anodically-bond the substrate 12 and the semiconductor substrate 66. Moreover, when the substrate 12 is formed as an insulating glass substrate containing an alkali metal ion, it is possible to isolate the substrate 12 and the semiconductor substrate 66 from each other with ease. Incidentally, the substrate 12 does not necessarily have to have insulating properties and may be formed as a conductive substrate formed of a low-resistance silicon material, for example. In such a case, the substrate 12 and the semiconductor substrate 66 are isolated from each other by an insulating film sandwiched between them. Furthermore, after the insulating film is also formed on wall surfaces of the first groove 24, the second groove 26, and the third groove 28, a first wiring line 30, a second wiring line 36, and a third wiring line 42 are disposed, thereby preventing a short circuit between the wiring lines.

Moreover, it is preferable to make a difference in a thermal expansion coefficient between the material of the substrate 12 and the material of the semiconductor substrate 66 as small as possible. Specifically, it is preferable that the difference in the thermal expansion coefficient between the material of the substrate 12 and the material of the semiconductor substrate 66 be 3 ppm/° C. or less. This makes it possible to reduce a residual stress between the substrate 12 and the semiconductor substrate 66.

Furthermore, on a bottom face of the first groove portion 24, the first wiring line 30 is disposed along the first groove portion 24. On a bottom face of the second groove portion 26, the second wiring line 36 is disposed along the second groove portion 26. On a bottom face of the third groove portion 28, the third wiring line 42 is disposed along the third groove portion 28.

The first wiring line 30 is a wiring line electrically connected to the first fixed electrode fingers 78 which will be described later. The second wiring line 36 is a wiring line electrically connected to the second fixed electrode fingers 80 which will be described later. The third wiring line 42 is a wiring line electrically connected to a fixed part 76 which will be described later.

Incidentally, ends (ends which are disposed in the terminal section 20) of the first wiring line 30, the second wiring line 36, and the third wiring line 42 become a first terminal electrode 34, a second terminal electrode 40, and a third terminal electrode 46, respectively.

Materials of the first wiring line 30, the second wiring line 36, and the third wiring line 42 are not limited to particular materials as long as the materials have conductivity, and various kinds of electrode materials can be used. For example, the materials include, for example, oxides (transparent electrode materials) such as ITO (Indium Tin Oxide), IZO (Indium Zinc Oxide), $In_3O_3$, $SnO_2$, $SnO_2$ containing Sb, and ZnO containing Al, and Au, Pt, Ag, Cu, Al or an alloy containing these elements, and one of them or a combination of two or more of them can be used.

Of these materials, as the materials of the wiring lines described above, the transparent electrode materials (in particular, ITO) are suitably used. When the wiring lines are formed of the transparent conductive materials and the substrate 12 is transparent, it is possible to identify a foreign object etc. visually with ease, the foreign object etc. present on surfaces of the fixed electrode fingers (the first fixed electrode fingers 78 and the second fixed electrode fingers 80) forming the fixed electrode section which is cut out from the semiconductor substrate 66, from the side of the substrate 12, the side opposite to the fixed electrode fingers, and thereby perform an inspection of the functional element 10 easily.

The movable section 68 is formed by being cut out from the semiconductor substrate 66 by etching and is formed of an arm 70, movable electrode fingers 72, flexible parts 74, and the fixed parts 76. Of these components, the arm 70, the movable electrode fingers 72, and the flexible parts 74 are disposed in a position facing the recessed portion 22 of the substrate 12, that is, a position surrounded with the recessed portion 22 when viewed from a Z-axis direction. As shown in FIG. 1, a direction of the length of the arm 70 is an X-axis direction, and the flexible parts 74 are disposed at both ends in the direction of the length of the arm 70. The movable electrode fingers 72 are disposed in a shape of a comb on side faces of the arm 70 along the length of the arm 70 (an X-axis direction) in such a way as to extend in a direction (a Y-axis direction) perpendicular to the direction of the length of the arm 70 at regular intervals along the length of the arm 70. The flexible parts 74 bend in the X-axis direction by a force in the X-axis direction. The fixed parts 76 are connected to ends of the flexible parts 74 and are bonded to the substrate 12. Moreover, one of the fixed parts 76 is disposed in a position in which the fixed part 76 is laid across the third groove portion 28 on the substrate 12.

The first fixed electrode fingers 78 are disposed in positions in which the first fixed electrode fingers 78 are laid across the first groove portion 24 and the second groove portion 26 on the substrate 12. Moreover, the first fixed electrode fingers 78 are disposed in such a way as to partly overlap with the recessed portion 22 when viewed from the Z-axis direction. Furthermore, the second fixed electrode fingers 80 are disposed in parallel with the first fixed electrode fingers 78 in positions in which the second fixed electrode fingers 80 are laid across the first groove portion 24 and the second groove portion 26 on the substrate 12. In addition, the second fixed electrode fingers 80 are disposed in such a way as to partly overlap with the recessed portion 22 when viewed from the Z-axis direction as is the case with the first fixed electrode fingers 78. Each first fixed electrode finger 78 and each second fixed electrode finger 80 are disposed in a corresponding one of positions sandwiched between the movable electrode fingers 72 disposed in the shape of a comb.

Figure 3A:
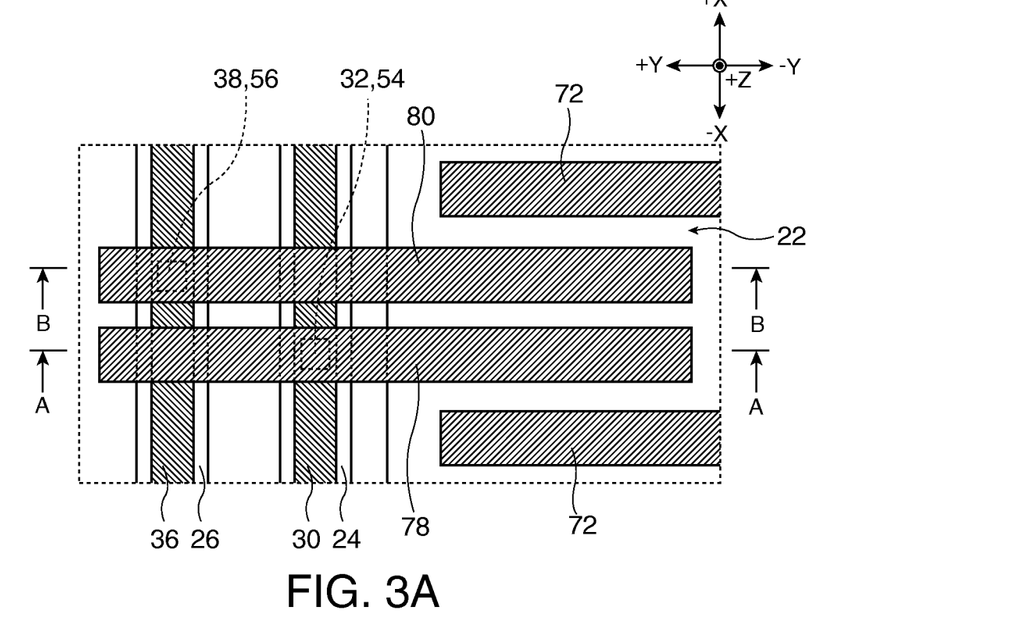
FIGS. 3A to 3C are enlarged views of a region including a first fixed electrode finger, a second fixed electrode finger, etc. which are shown in FIG. 1, FIG. 3A being a plan view, FIG. 3B being a sectional view taken on a line A-A of FIG. 3A, and FIG. 3C being a sectional view taken on a line B-B of FIG. 3A.
Figure 3B:
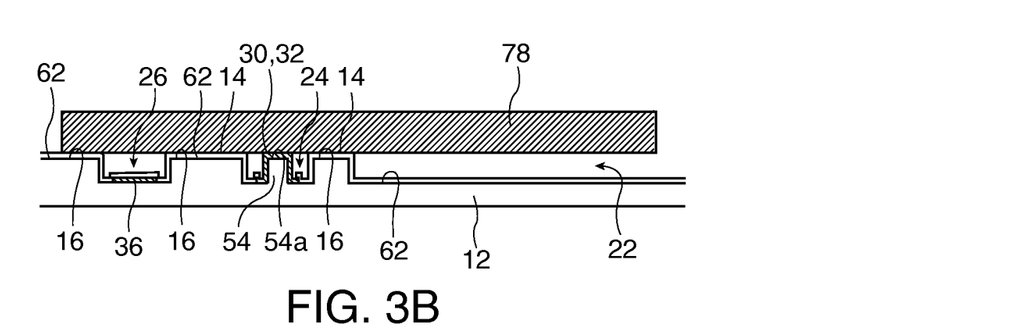
Figure 3C:
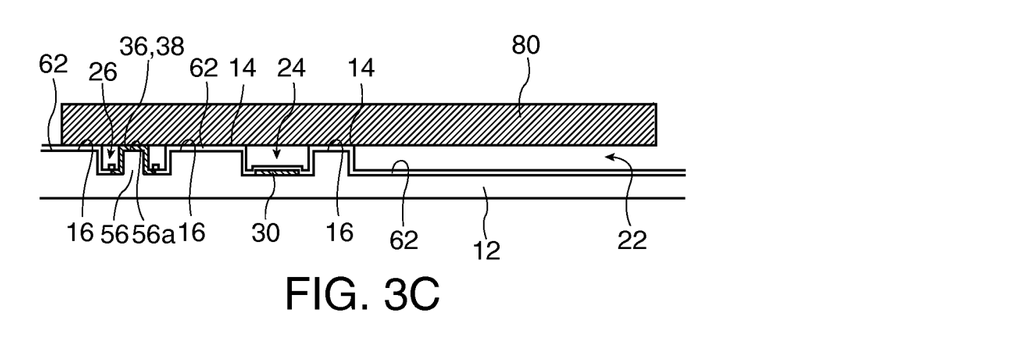

In FIGS. 3A to 3C, enlarged views of a region including the first fixed electrode finger, the second fixed electrode finger, etc. which are shown in FIG. 1 are shown. FIG. 3A is a plan view, FIG. 3B is a sectional view taken on a line A-A of FIG. 3A, and FIG. 3C is a sectional view taken on a line B-B of FIG. 3A. Moreover, in FIGS. 4A and 4B, enlarged views of a region including the fixed part etc. shown in FIG. 1 are shown, FIG. 4A is a plan view, and FIG. 4B is a sectional view taken on a line C-C of FIG. 4A.

As shown in FIGS. 3A to 3C, in a position of the first groove portion 24, the position facing the first fixed electrode finger 78 (the position overlapping with the first fixed electrode finger 78 in a plan view), a raised portion 54 is formed. In addition, the first wiring line 30 is disposed from the inside of the first groove portion 24 to an area on a top surface (a bonded surface) 54a of the raised portion 54. Therefore, the portion corresponding to the top surface 54a of the raised portion 54 becomes a connecting portion 32 which is connected to the first fixed electrode finger 78. As a result of the connecting portion 32 and the first fixed electrode finger 78 being connected to each other, the first terminal electrode 34 is electrically connected to the first fixed electrode finger 78 via the first wiring line 30 (the connecting portion 32). Moreover, since the thickness of the first wiring line 30 is smaller than the depth of the first groove portion 24, the first wiring line 30 is not exposed from the principal surface 16 and therefore not connected to the second fixed electrode finger 80.

As shown in FIGS. 3A to 3C, in a position of the second groove portion 26, the position facing the second fixed electrode finger 80 (the position overlapping with the second fixed electrode finger 80 in a plan view), a raised portion 56 is formed. In addition, the second wiring line 36 is disposed from the inside of the second groove portion 26 to an area on a top surface (a bonded surface) 56a of the raised portion 56. Therefore, the portion corresponding to the top surface 56a of the raised portion 56 becomes a connecting portion 38 which is connected to the second fixed electrode finger 80. As a result of the connecting portion 38 and the second fixed electrode finger 80 being connected to each other, the second terminal electrode 40 is electrically connected to the second fixed electrode finger 80 via the second wiring line 36 (the connecting portion 38). Moreover, since the thickness of the second wiring line 36 is smaller than the depth of the second groove portion 26, the second wiring line 36 is not exposed from the principal surface 16 and therefore not connected to the first fixed electrode finger 78.

Figure 4A:
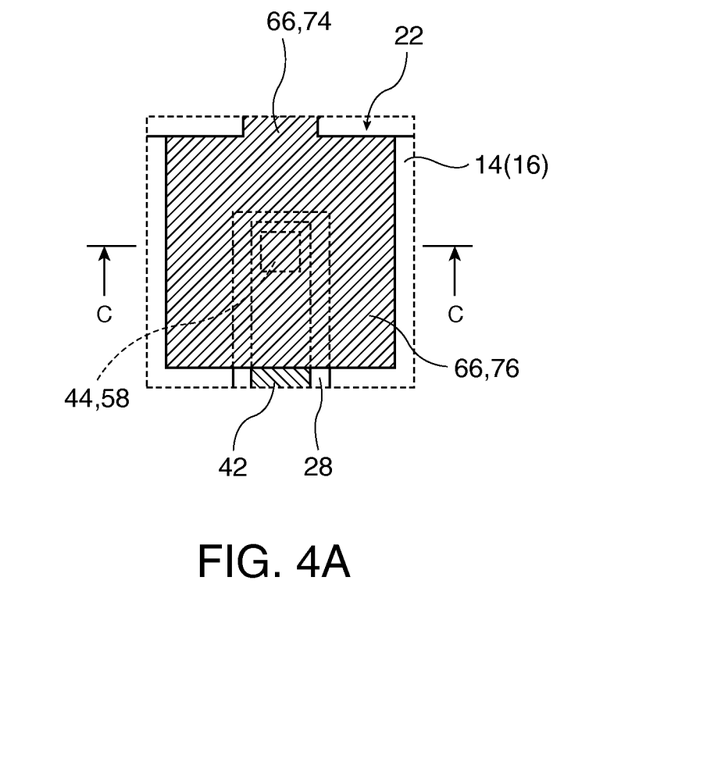
FIGS. 4A and 4B are enlarged views of a region including a fixed part etc. shown in FIG. 1, FIG. 4A being a plan view and FIG. 4B being a sectional view taken on a line C-C of FIG. 4A.
Figure 4B:
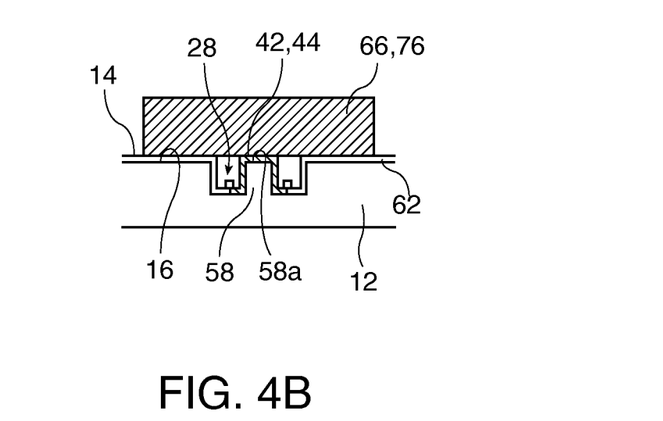

As shown in FIGS. 4A and 4B, in a position of the third groove portion 28, the position facing the fixed part 76 (the position overlapping with the fixed part 76 in a plan view), a raised portion 58 is formed. In addition, the third wiring line 42 is disposed from the inside of the third groove portion 28 to an area on a top surface (a bonded surface) 58a of the raised portion 58. Therefore, the portion corresponding to the top surface 58a of the raised portion 58 becomes a connecting portion 44 which is connected to the fixed part 76. As a result of the connecting portion 44 and the fixed part 76 being connected to each other, the third terminal electrode 46 is electrically connected to the movable electrode fingers 72 via the third wiring line 42 (the connecting portion 44), the fixed part 76, the flexible part 74, and the arm 70.

Therefore, in the structure described above, a first capacitor is formed between the first fixed electrode fingers 78 and the movable electrode fingers 72 facing the first fixed electrode fingers 78 from a −X-axis direction, and a second capacitor is formed between the second fixed electrode fingers 80 and the movable electrode fingers 72 facing the second fixed electrode fingers 80 from a +X-axis direction. When the functional element 10 undergoes acceleration in the −X-axis direction, for example, in this state, the arm 70 and the movable electrode fingers 72 are displaced relative to the functional element 10 in the +X-axis direction by an inertial force. At this time, since a space between each first fixed electrode finger 78 and the movable electrode finger 72 facing the first fixed electrode finger 78 from the −X-axis direction is narrowed, the capacitance of the first capacitor is increased. Moreover, since a space between each second fixed electrode finger 80 and the movable electrode finger 72 facing the second fixed electrode finger 80 from the +X-axis direction is widened, the capacitance of the second capacitor is decreased. On the other hand, when the arm 70 and the movable electrode fingers 72 are displaced relative to the functional element 10 in the −X-axis direction, the capacitance of the first capacitor is decreased and the capacitance of the second capacitor is increased.

Therefore, by monitoring a difference between a change in the capacitance of the first capacitor, the change detected between the first terminal electrode 34 and the third terminal electrode 46, and a change in the capacitance of the second capacitor, the change detected between the second terminal electrode 40 and the third terminal electrode 46, it is possible to detect the magnitude and direction of a physical quantity such as acceleration which is applied to the functional element 10. In addition, since the difference between the changes in the capacitance of the two capacitors is monitored as in this embodiment, it is possible to use the functional element 10 as a sensor element that performs high-sensitivity detection of the physical quantity such as the acceleration.

Incidentally, as shown in FIGS. 3A to 3C and FIGS. 4A and 4B, the insulating layer 62 is stacked on the substrate 12. The insulating layer 62 is removed in a position (the connecting portion 32, see FIG. 3B) in which the first wiring line 30 is connected to the first fixed electrode finger 78, a position (the connecting portion 38, see FIG. 3C) in which the second wiring line 36 is connected to the second fixed electrode finger 80, and a position (the connecting portion 44, see FIG. 4B) in which the third wiring line 42 is connected to the fixed part 76, and the wiring lines are exposed in these portions. Moreover, the insulating layer 62 on each terminal electrode is removed, and each terminal electrode is exposed. Therefore, the insulating layer 62 is disposed in a region of the principal surface 16 of the substrate 12, the region other than the bonded surfaces (the top surfaces 54a, 56a, and 58a) of the raised portions 54, 56, and 58 and the terminal electrodes.

Figure 5:
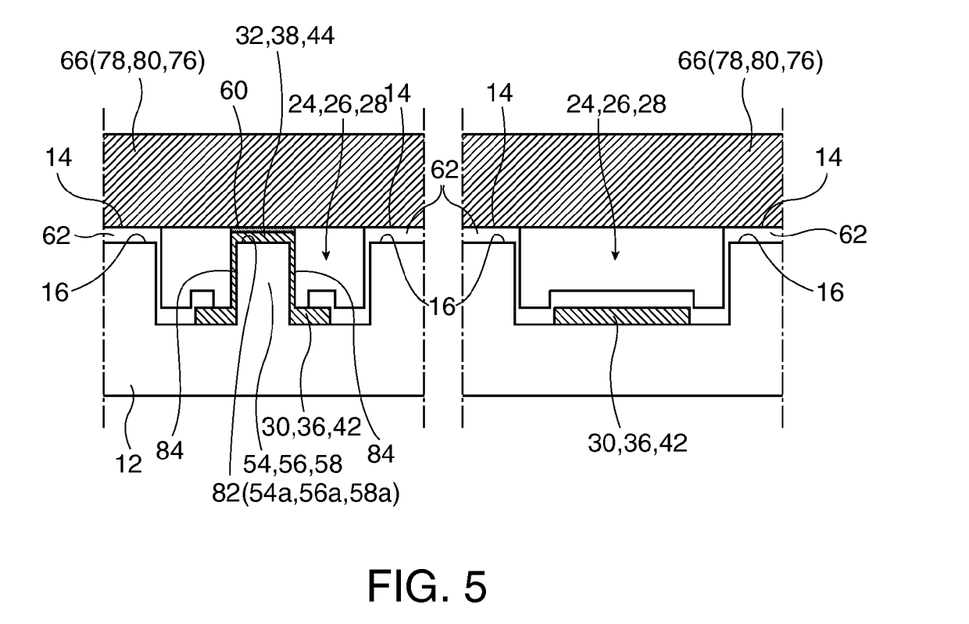
FIG. 5 is a detail view of a wiring line and a raised portion disposed in a groove portion.

In FIG. 5, a detail view of the wiring line and the raised portion disposed in the groove portion is shown. A drawing on the left side of FIG. 5 is a sectional view of a portion in which the raised portions 54, 56, and 58 are formed in the first groove portion 24, the second groove portion 26, and the third groove portion 28, respectively, and a drawing on the right side of FIG. 5 is a sectional view of a portion in which the raised portions 54, 56, and 58 are not formed in the first groove portion 24, the second groove portion 26, and the third groove portion 28, respectively. The first groove portion 24, the second groove portion 26, and the third groove portion 28 each have a shape shown in the drawing on the right side of FIG. 5, and the semiconductor substrate 66 (the first fixed electrode finger 78, the second fixed electrode finger 80, the fixed part 76) is disposed on the substrate 12 in such a way as to be laid across these groove portions. As shown in the drawing on the right side of FIG. 5, the first wiring line 30, the second wiring line 36, and the third wiring line 42 are disposed in the first groove portion 24, the second groove portion 26, and the third groove portion 28, respectively. Incidentally, the width of each wiring line is designed to be narrower than the width of the bottom face of each groove portion, and each wiring line is disposed in such a way as to pass through a width-direction center of each groove portion.

On the other hand, as shown in the drawing on the left side of FIG. 5, the raised portions 54, 56, and 58 are formed in a position of the first groove portion 24, the position facing the first fixed electrode finger 78, a position of the second groove portion 26, the position facing the second fixed electrode finger 80, and a position of the third groove portion 28, the position facing the fixed part 76, respectively. Therefore, as shown in the drawing on the left side of FIG. 5, the first wiring line 30, the second wiring line 36, and the third wiring line 42 are disposed in such a way as to cover end faces 82 (bonded surfaces) and side faces 84 of the raised portions 54, 56, and 58. Moreover, the end faces 82 (the top surfaces 54a, 56a, and 58a) of the raised portions 54, 56, and 58 are flush with the principal surface 16 of the substrate 12. Therefore, portions of the wiring lines, the portions disposed on the end faces 82 of the raised portions 54, 56, and 58, become the above-described connecting portions 32, 38, and 44. Furthermore, on the connecting portions 32, 38, and 44, a contact layer 60 is disposed. When the semiconductor substrate 66 is formed of silicon, a material forming a eutectic crystal with silicon is suitable for forming the contact layer 60, and Au or the like is a suitable material and Al or the like is also a suitable material. By providing the contact layer 60, it is possible to reduce contact resistance between the semiconductor substrate 66 (the first fixed electrode finger 78, the second fixed electrode finger 80, the fixed part 76) and each wiring line. Moreover, as described above, by placing the contact layer 60 between each wiring line and the semiconductor substrate 66 as a buffer film, it is possible to make the surfaces of the wiring lines formed on the bonded surfaces of the raised portions 54, 56, and 58 jut from the principal surface 16 of the substrate 12. In addition, this makes it possible to adjust a level of the jutted portions with the contact layer 60 and thereby bond the raised portions and the semiconductor substrate 66 more firmly.

Moreover, as described earlier, the insulating layer 62 is disposed on the substrate 12 other than a portion in which the connecting portions 32, 38, and 44 and the terminal electrodes are formed. In this embodiment, the surface of the insulating layer 62 forms the bonded surface 14 which is bonded to the semiconductor substrate 66. In addition, the thickness of the insulating layer 62 is formed to be nearly equal to the total thickness of the connecting portion 32, 38, or 44 and the contact layer 60 or to be slightly smaller than the total thickness of the connecting portion 32, 38, or 44 and the contact layer 60. Here, by forming the insulating layer 62 by using $SiO_2$, it is possible to anodically-bond the semiconductor substrate 66 and the substrate 12 via the insulating layer 62.

When the wiring lines disposed in the grooves on the substrate 12 and the semiconductor substrate 66 (the fixed electrode finger etc.) disposed on the substrate 12 are electrically connected, a method may be used by which a bump formed of Au or the like is disposed in a position of each wiring line, the position facing the semiconductor substrate 66, and the semiconductor substrate 66 is bonded to the substrate 12 while flattening the bump. However, when such a method is used, since the thickness of a member (the wiring line+the bump) formed of each wiring line and the bump and performing electrical connection from the wiring line in the groove to the semiconductor substrate is increased, the stiffness in a thickness direction is reduced, resulting in a reduction in the reliability of electrical connection between each wiring line and the semiconductor substrate 66. On the other hand, in this embodiment, a structure in which the wiring lines are disposed on the end faces 82 (the top surfaces 54*a*, 56*a*, and 58*a*) and the side faces 84 of the raised portions 54, 56, and 58 is adopted, and the connecting portions 32, 38, and 44, each forming part of the corresponding wiring line, the connecting portions 32, 38, and 44 which are formed on the end faces 82 of the raised portions 54, 56, and 58, are connected to the semiconductor substrate 66. This makes it possible to perform electrical connection between each wiring line and the semiconductor substrate 66 (the first fixed electrode finger 78, the second fixed electrode finger 80, the fixed part 76) without increasing the thickness of each wiring line and thereby ensure the stiffness of the member (the wiring line) in the thickness direction, the member (the wiring line) which is electrically connected to the semiconductor substrate 66. Furthermore, since it is possible to form each wiring line as a thin wiring line, it is possible to maintain the flatness of the wiring lines (the connecting portions 32, 38, and 44) on the end faces 82 of the raised portions 54, 56, and 58. This makes it possible to increase the reliability of electrical connection between each wiring line and the semiconductor substrate 66.

Moreover, in this embodiment, the end faces 82 of the raised portions 54, 56, and 58 are disposed in such a way as to be flush with the principal surface 16 of the substrate 12. As a result, as will be described later, since it is possible to perform the formation of the raised portions 54, 56, and 58 concurrently with the formation of the groove portions, it is possible to simplify a production process. Furthermore, since the strength of the raised portions 54, 56, and 58 can be ensured by the strength of the substrate 12, it is possible to increase the reliability of electrical connection between each wiring line and the semiconductor substrate 66.

Figure 6A:
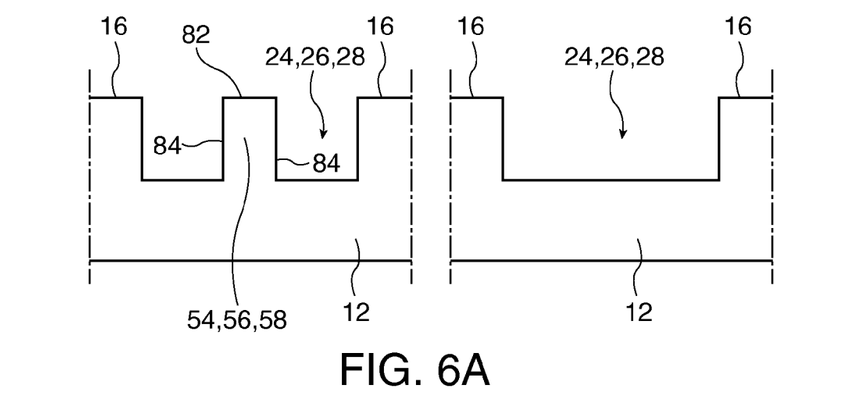
FIGS. 6A to 6C are diagrams each showing a production process of the functional element of the embodiment, FIG. 6A showing a process in which the groove portion and the raised portion are formed, FIG. 6B showing a process in which a wiring material is stacked on a substrate, and FIG. 6C showing a process in which the wiring line is formed by etching.
Figure 6B:
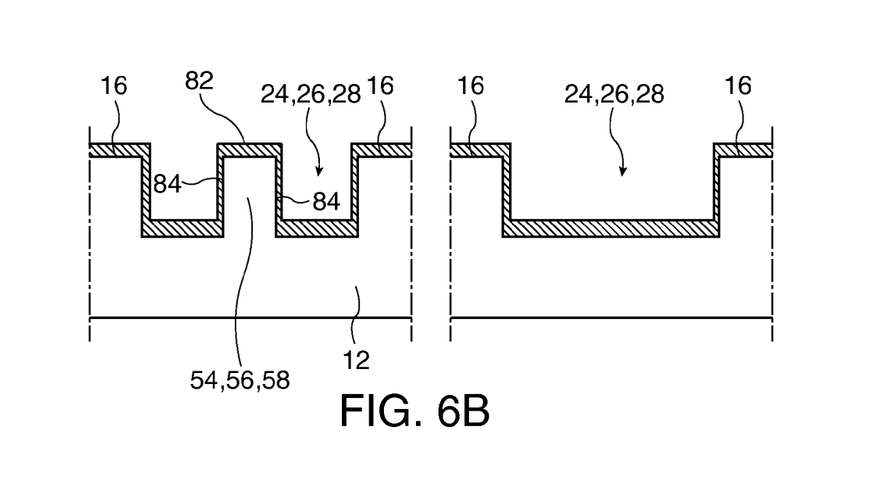
Figure 6C:
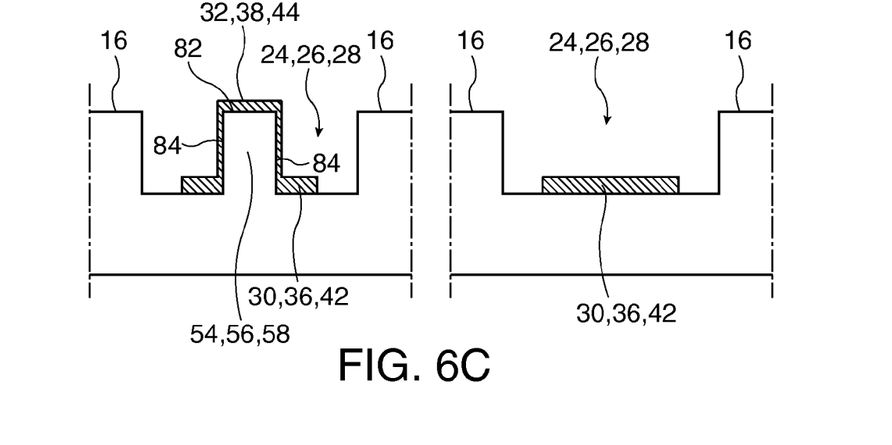
Figure 7A:
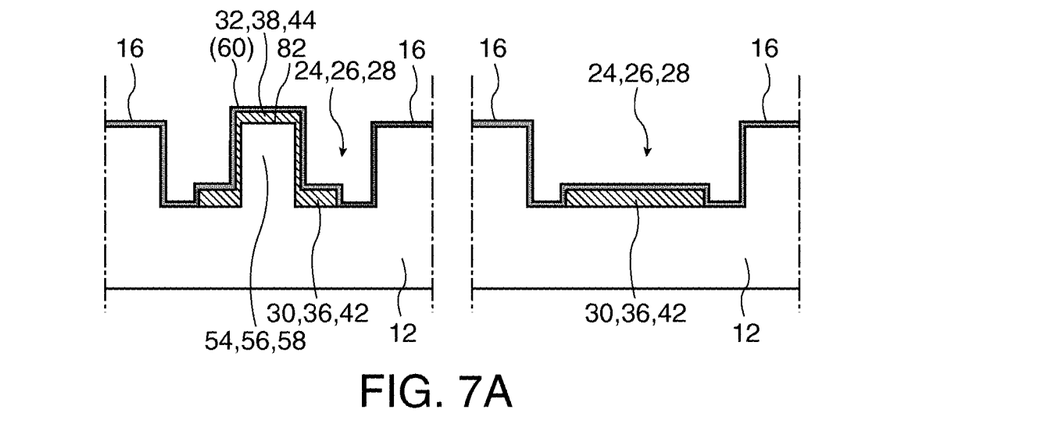
FIGS. 7A to 7C are diagrams each showing a production process of the functional element of the embodiment, FIG. 7A showing a process in which a contact layer material is stacked on the substrate, FIG. 7B showing a process in which a contact layer is formed by etching, and FIG. 7C showing a process in which an insulating film is stacked on the substrate.
Figure 7B:
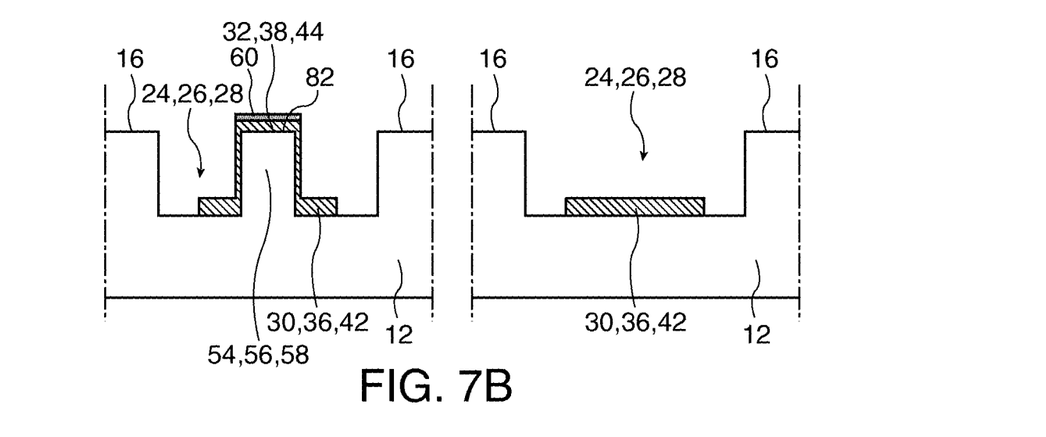
Figure 7C:
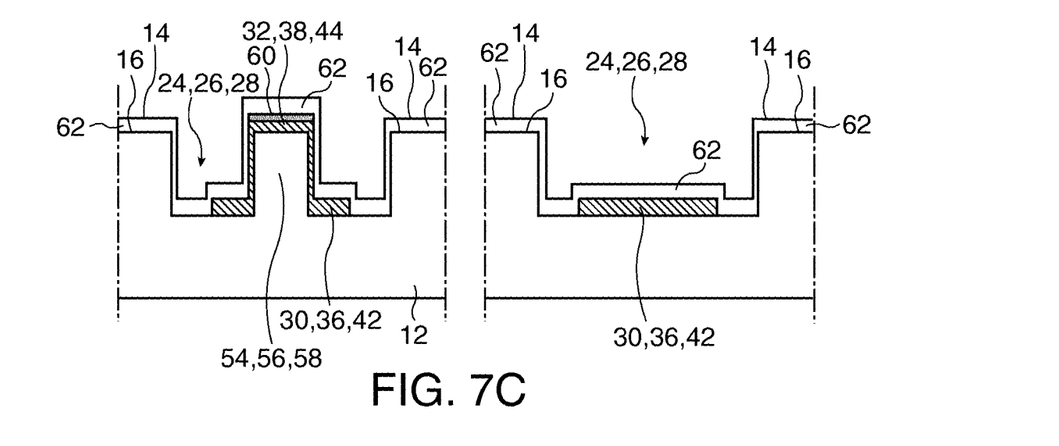
Figure 8A:
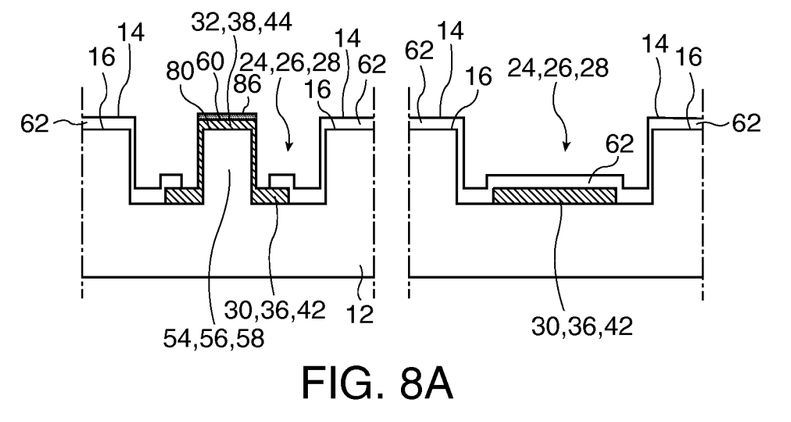
FIGS. 8A to 8C are diagrams each showing a production process of the functional element of the embodiment, FIG. 8A showing a process in which the contact layer and the wiring line are exposed by etching, FIG. 8B showing a process in which the substrate and a semiconductor substrate are bonded together, and FIG. 8C showing a process in which the semiconductor substrate is turned into a thin film.
Figure 8B:
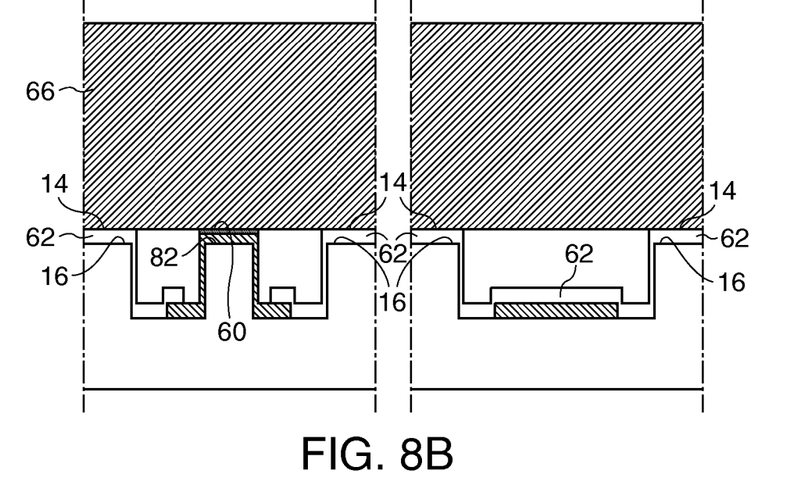
Figure 8C:
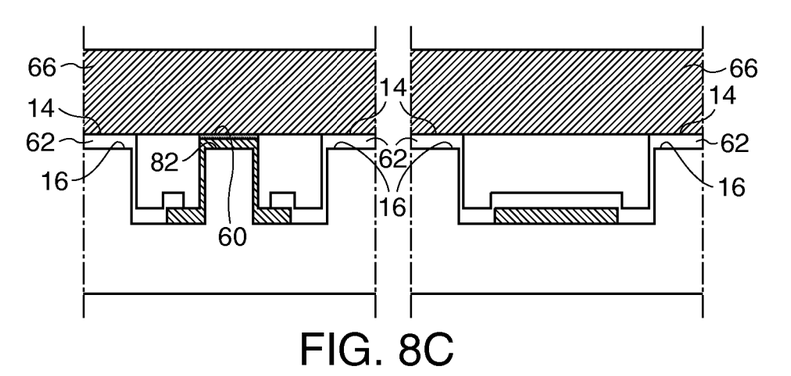

In FIGS. 6A to 6C, production processes of the functional element of this embodiment are shown, FIG. 6A shows a process in which the groove portion and the raised portion are formed, FIG. 6B shows a process in which a wiring material is stacked on the substrate, and FIG. 6C shows a process in which the wiring line is formed by etching. Moreover, in FIGS. 7A to 7C, production processes of the functional element of this embodiment are shown, FIG. 7A shows a process in which a contact layer material is stacked on the substrate, FIG. 7B shows a process in which the contact layer is formed by etching, and FIG. 7C shows a process in which the insulating layer is stacked on the substrate. Furthermore, in FIGS. 8A to 8C, production processes of the functional element of this embodiment are shown, FIG. 8A shows a process in which the contact layer and the wiring line are exposed by etching, FIG. 8B shows a process in which the substrate and the semiconductor substrate are bonded together, and FIG. 8C shows a process in which the semiconductor substrate is turned into a thin film. In addition, in FIG. 9, a diagram showing a production process of the functional element of this embodiment, the diagram which is a plan view showing a state before etching after the semiconductor substrate was turned into a thin film, is shown.

The production process of the functional element 10 of this embodiment will be described by using FIGS. 6A to 6C to FIG. 9. Incidentally, drawings on the left side of FIGS. 6A to 6C to FIGS. 8A to 8C are sectional views of a portion in which the raised portion is formed in each groove portion, and drawings on the right side of these drawings are sectional views of a portion in which the raised portion is not formed in each groove portion. First, as shown in FIG. 6A, in the principal surface 16 of the substrate 12, the first groove portion 24, the second groove portion 26, and the third groove portion 28 are formed by etching such as wet etching or dry etching. Moreover, before the formation of the groove portions, the recessed portion 22 (not shown in FIGS. 6A to 6C to FIGS. 8A to 8C) is formed in the principal surface 16 of the substrate 12. At this time, in a position of the first groove portion 24, the position facing the first fixed electrode finger 78, a position of the second groove portion 26, the position facing the second fixed electrode finger 80, and a position of the third groove portion 28, the position facing the fixed part 76, etching is performed in such a way that outer shapes of the raised portions 54, 56, and 58 are left. As a result, the raised portions 54, 56, and 58, each having the end face 82 and the side faces 84, are formed, and the end face 82 is flush with the principal surface 16.

Then, as shown in FIG. 6B, a wiring material (for example, ITO) is deposited on the substrate 12 by sputtering or the like, and, as shown in FIG. 6C, etching is performed on the wiring material in such a way as that portions which will become the first wiring line 30, the second wiring line 36, and the third wiring line 42 are left. As a result, the wiring lines are formed, and the connecting portion 32, the connecting portion 38, and the connecting portion 44 are formed in the raised portion 54, the raised portion 56, and the raised portion 58, respectively.

Next, as shown in FIG. 7A, a material (for example, Au) of the contact layer is deposited on the substrate 12 as a buffer layer by sputtering or the like, and, as shown in FIG. 7B, the contact layer material is etched in such a way that the contact layer material is left in a position in which the contact layer 60 is to be formed. As a result, the contact layer 60 is formed on the connecting portions 32, 38, and 44. At this time, the top surface of the contact layer 60 juts to a level higher than that of the principal surface 16 of the substrate 12. Then, as shown in FIG. 7C, the insulating layer (for example, $SiO_2$) is deposited on the substrate 12 by low-temperature CVD, sputtering, or the like. At this time, the deposition is performed in such a way that the thickness of the insulating layer 62 is nearly equal to the total thickness of each wiring line (the connecting portion 32, the connecting portion 38, the connecting portion 44) and the contact layer 60 or is slightly smaller than the total thickness of each wiring line (the connecting portion 32, the connecting portion 38, the connecting portion 44) and the contact layer 60. Then, as shown in FIG. 8A, etching is performed on a portion of the insulating layer 62, the portion covering the contact layer 60 (and the surrounding wiring line), whereby the contact layer 60 (the connecting portions 32, 38, and 44) is exposed. In this state, a connecting surface 86 of the contact layer 60, the connecting surface 86 which is connected to the semiconductor substrate 66, is flush with the bonded surface 14 of the insulating layer 62 disposed on the substrate 12, the bonded surface 14 which is bonded to the semiconductor substrate 66, or protrudes and is somewhat closer to the semiconductor substrate 66 than the bonded surface 14 of the insulating layer 62. The latter protruding connecting surface 86 can make conductive bonding with the semiconductor substrate 66 stronger.

Figure 9:
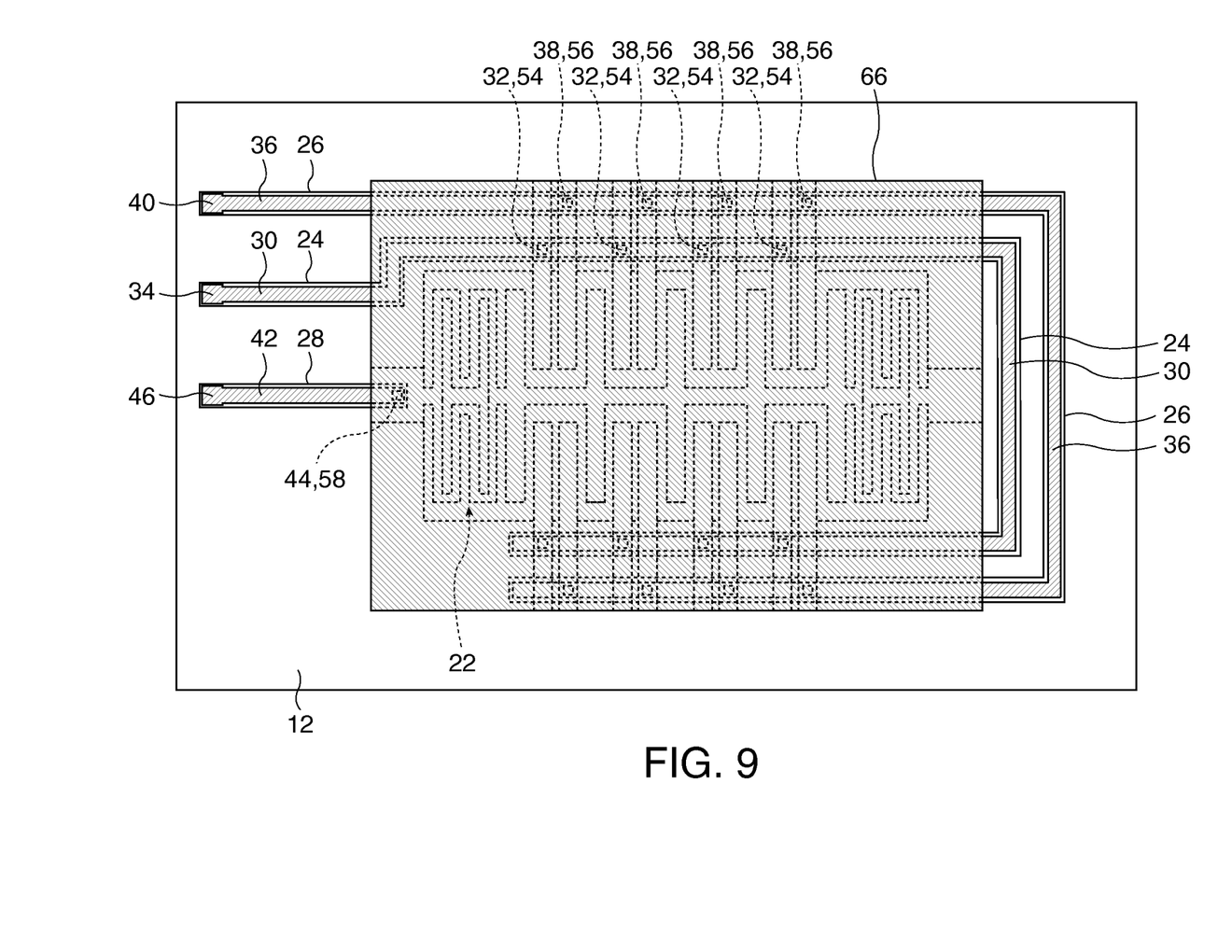
FIG. 9 is a diagram showing a production process of the functional element of the embodiment and is a plan view showing a state before etching after the semiconductor substrate was turned into a thin film.

Then, as shown in FIG. 8B, the semiconductor substrate 66 is placed on the substrate 12, and the substrate 12 and the semiconductor substrate 66 are bonded together by anodic bonding. When the contact layer 60 (the connecting portions 32, 38, and 44) protrudes and is closer to the semiconductor substrate 66 than the insulating layer 62 as describe above, the contact layer 60 (the connecting portions 32, 38, and 44) is pressure-bonded to the semiconductor substrate 66, and the connecting portions 32, 38, and 44 and the semiconductor substrate 66 are electrically connected via the contact layer 60. Next, as shown in FIG. 8C, the semiconductor substrate 66 is turned into a thin film by polishing or the like as necessary. By these processes, as shown in FIG. 9, the semiconductor substrate 66 from which the fixed electrode fingers and the movable section 68 are not cut out is bonded to the substrate 12.

Finally, the semiconductor substrate 66 is etched after the outer shapes of the first fixed electrode fingers 78, the second fixed electrode fingers 80, and the movable section 68 (the arm 70, the movable electrode fingers 72, the flexible parts 74, and the fixed parts 76), the lid 64 is connected to the outer region 18, whereby the fixed electrode fingers and the movable section 68 are sealed. In this way, the functional element 10 of this embodiment is formed. Incidentally, in this embodiment, the insulating layer 62 is formed on the principal surface 16 of the substrate 12, and the surface of the insulating layer 62 is used as the bonded surface 14 which is bonded to the semiconductor substrate 66. However, without the formation of the insulating layer 62, the functional element 10 of this embodiment can be formed. In this case, the principal surface 16 of the substrate 12 becomes the bonded surface 14. In addition, when the substrate 12 is formed of the same material ($SiO_2$) as the insulating layer 62, it is possible to anodically-bond the substrate 12 and the semiconductor substrate 66.

Figure 10:
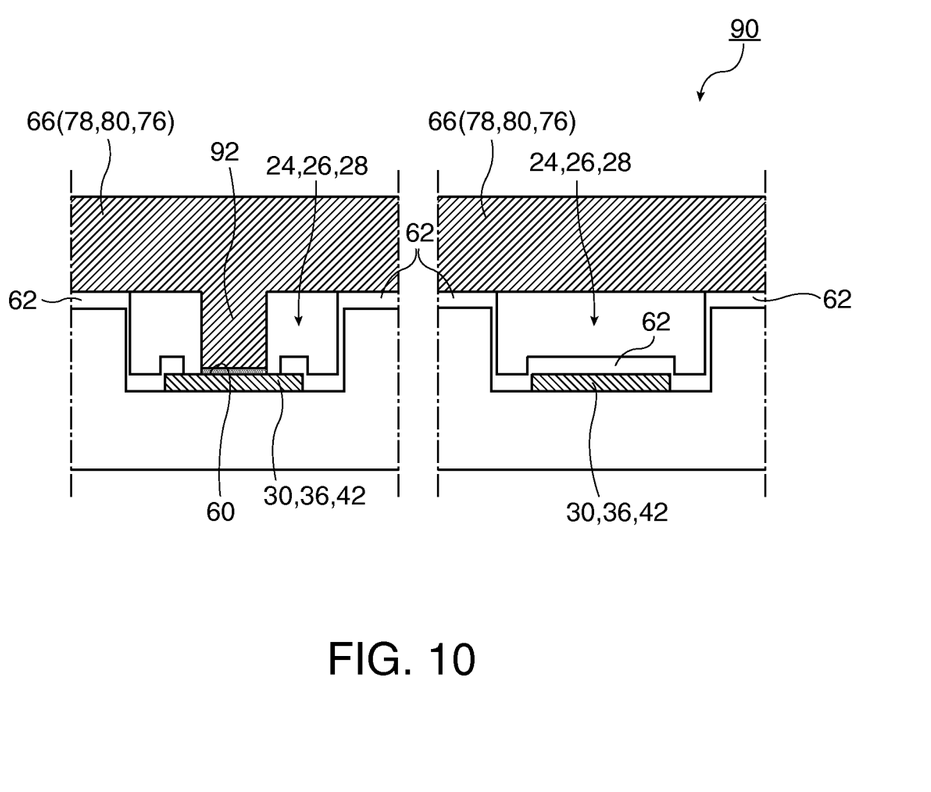
FIG. 10 shows a modified example of the functional element of the embodiment.

In FIG. 10, a modified example of the functional element of this embodiment is shown. A functional element 90 shown in the modified example is similar to the functional element 10 described above, but differs therefrom in that the raised portions 54, 56, and 58 for electrically connecting the semiconductor substrate 66 and the wiring lines are not provided and raised portions 92 are provided on the semiconductor substrate 66. Therefore, the raised portions 92 are formed in the semiconductor substrate 66 in a portion which will become the first fixed electrode finger 78, the portion in a position facing the first wiring line 30, a portion which will become the second fixed electrode finger 80, the portion in a position facing the second wiring line 36, and a portion which will become the fixed part 76, the portion in a position facing the third wiring line 42. The raised portions 92 can be formed by dry etching, wet etching, or the like.

On the other hand, the first wiring line 30, the second wiring line 36, and the third wiring line 42 are exposed as a result of portions of the insulating layer 62 disposed on the substrate 12, the portions facing the raised portions 92, being etched, and the contact layer 60 is formed in the exposed portions of the wiring lines. In the functional element 90 in the modified example, the production processes of the first groove portion 24, the second groove portion 26, the third groove portion 28, the first wiring line 30, the second wiring line 36, the third wiring line 42, the insulating layer 62, the contact layer 60, etc. which are formed on the substrate 12 are similar to those described above, and their descriptions are omitted.

With the functional elements 10 and 90 according to the above-described embodiment and modified example, it is possible to build a physical quantity sensor by connecting the functional element 10 or 90 to an integrated circuit (IC) or the like that drives the functional element 10 or 90. For example, by forming the IC as an angular velocity detection circuit, an acceleration detection circuit, or a pressure detection circuit, the functional elements 10 and 90 can be formed as a gyro sensor, an acceleration sensor, or a pressure sensor. Moreover, it is possible to build an electronic apparatus with the functional element 10 according to the above-described embodiment or the functional element 90 according to the above-described modified example, the electronic apparatus such as a digital camera, a personal computer, a cellular telephone, a medical instrument, and various kinds of measuring devices.

The entire disclosure of Japanese Patent Application No. 2011-094232, filed Apr. 20, 2011 is expressly incorporated by reference herein.

What is claimed is:

1. A functional element comprising:
    a substrate having a principal surface on which a groove portion is provided, the groove portion in which a wiring line is provided; and
    a fixed electrode section laid across the groove portion on the substrate,
    wherein
    in a connection between the fixed electrode section and the wiring line, a raised portion formed by using at least one of the substrate and the fixed electrode section is disposed,
    the raised portion is formed integrally with the substrate, and
    an end face of the raised portion is flush with the principal surface of the substrate.

2. The functional element according to claim 1, wherein between the substrate and the fixed electrode section, an insulating film is provided in a region other than the raised portion.

3. The functional element according to claim 1, wherein on the substrate, a movable section is disposed, and in the movable section, a movable electrode section is provided in a position facing the fixed electrode section.

4. The functional element according to claim 1, wherein the substrate is formed of an insulating material, and the fixed electrode section is formed of a semiconductor material.

5. A sensor element comprising the functional element according to claim 1.

6. An electronic apparatus comprising the functional element according to claim 1.

7. A functional element comprising:
    a substrate having a principal surface on which a groove portion is provided, the groove portion in which a wiring line is provided; and a fixed electrode section laid across the groove portion on the substrate, wherein in a connection between the fixed electrode section and the wiring line, a raised portion formed by using at least one of the substrate and the fixed electrode section is disposed, on the substrate, a movable section is disposed, and in the movable section, a movable electrode section is provided in a position facing the fixed electrode section.

8. The functional element according to claim 7, wherein the raised portion is formed integrally with the substrate, and an end face of the raised portion is flush with the principal surface of the substrate.

9. The functional element according to claim 7, wherein between the substrate and the fixed electrode section, an insulating film is provided in a region other than the raised portion.

10. The functional element according to claim 7, wherein the substrate is formed of an insulating material, and the fixed electrode section is formed of a semiconductor material.

11. A sensor element comprising the functional element according to claim 7.

12. An electronic apparatus comprising the functional element according to claim 7.

13. A functional element comprising:

a substrate having a principal surface on which a groove portion is provided, the groove portion in which a wiring line is provided; and a fixed electrode section laid across the groove portion on the substrate, wherein in a connection between the fixed electrode section and the wiring line, a raised portion formed by using at least one of the substrate and the fixed electrode section is disposed, the substrate is formed of an insulating material, and the fixed electrode section is formed of a semiconductor material.

14. The functional element according to claim 13, wherein the raised portion is formed integrally with the substrate, and an end face of the raised portion is flush with the principal surface of the substrate.

15. The functional element according to claim 13, wherein between the substrate and the fixed electrode section, an insulating film is provided in a region other than the raised portion.

16. The functional element according to claim 13, wherein on the substrate, a movable section is disposed, and in the movable section, a movable electrode section is provided in a position facing the fixed electrode section.

17. A sensor element comprising the functional element according to claim 13.

18. An electronic apparatus comprising the functional element according to claim 13.

* * * * *